(12) United States Patent
Mardilovich et al.

(10) Patent No.: US 9,611,559 B2
(45) Date of Patent: Apr. 4, 2017

(54) NANO-STRUCTURE AND METHOD OF MAKING THE SAME

(75) Inventors: Peter Mardilovich, Corvallis, OR (US); Qingqiao Wei, Corvallis, OR (US); Irina Nikolaevna Milonova, Corvallis, OR (US); Anthony M. Fuller, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 430 days.

(21) Appl. No.: 13/822,070

(22) PCT Filed: Oct. 21, 2010

(86) PCT No.: PCT/US2010/053578
§ 371 (c)(1),
(2), (4) Date: Mar. 11, 2013

(87) PCT Pub. No.: WO2012/054043
PCT Pub. Date: Apr. 26, 2012

(65) Prior Publication Data
US 2013/0168253 A1    Jul. 4, 2013

(51) Int. Cl.
*C25D 1/00* (2006.01)
*B81C 1/00* (2006.01)
(Continued)

(52) U.S. Cl.
CPC .......... *C25D 1/006* (2013.01); *B81C 1/00031* (2013.01); *C25D 11/045* (2013.01);
(Continued)

(58) Field of Classification Search
CPC ...... C25D 1/006; C25D 11/045; C25D 11/24; C25D 11/12; C25D 11/26; B81C 1/00031;
(Continued)

(56) References Cited

U.S. PATENT DOCUMENTS

| 5,581,091 A | 12/1996 | Moskovits et al. |
| 6,359,288 B1 | 3/2002 | Ying et al. |

(Continued)

FOREIGN PATENT DOCUMENTS

| CA | 2137013 | 5/1996 |
| CN | 101255588 | 9/2008 |

(Continued)

OTHER PUBLICATIONS

Lin, et al.; "Microwatt MOSLED Using SiOx With Buried Si Nanocrystals on Si Nano-Pillar Array"; Journal of Lightwave Technology; Jun. 1, 2008, vol. 26; No. 11; pp. 1486-1491; See figure I.

(Continued)

*Primary Examiner* — Laura Auer
(74) *Attorney, Agent, or Firm* — Dierker & Kavanaugh, P.C.

(57) ABSTRACT

A nano-structure includes an oxidized layer, and at least two sets of super nano-pillars positioned on the oxidized layer. Each of the at least two sets of super nano-pillars includes a plurality of super nano-pillars, where each set is separated a spaced distance from each other set.

10 Claims, 9 Drawing Sheets

(51) Int. Cl.
  *C25D 11/12* (2006.01)
  *C25D 11/24* (2006.01)
  *C25D 11/26* (2006.01)
  *C25D 11/04* (2006.01)

(52) U.S. Cl.
  CPC .............. *C25D 11/12* (2013.01); *C25D 11/24* (2013.01); *C25D 11/26* (2013.01)

(58) Field of Classification Search
  CPC ..... Y10T 428/24355; Y10T 428/12611; Y10T 428/12993
  See application file for complete search history.

(56) References Cited

U.S. PATENT DOCUMENTS

| | | | |
|---|---|---|---|
| 6,610,463 | B1 | 8/2003 | Ohkura et al. |
| 6,914,008 | B2 | 7/2005 | Den et al. |
| 6,972,146 | B2 | 12/2005 | Den et al. |
| 6,982,217 | B2 | 1/2006 | Imada et al. |
| 7,079,250 | B2 | 7/2006 | Mukai |
| 7,192,510 | B2 | 3/2007 | Den et al. |
| 7,208,077 | B1 | 4/2007 | Albers et al. |
| 7,265,375 | B2 | 9/2007 | Zhang et al. |
| 7,267,859 | B1 | 9/2007 | Rabin et al. |
| 7,322,871 | B2 | 1/2008 | Lambertini et al. |
| 7,381,658 | B2 | 6/2008 | Mardilovich et al. |
| 7,517,554 | B2 | 4/2009 | Saito et al. |
| 7,569,905 | B2 | 8/2009 | Hantschel et al. |
| 7,572,669 | B2 | 8/2009 | Tuominen et al. |
| 7,594,982 | B1 | 9/2009 | Rocheisen et al. |
| 7,686,885 | B2 | 3/2010 | Ku et al. |
| 7,790,469 | B2 | 9/2010 | Wang et al. |
| 2002/0090649 | A1 | 7/2002 | Chan et al. |
| 2002/0121851 | A1 | 9/2002 | Yasui et al. |
| 2004/0053167 | A1 | 3/2004 | Hotta |
| 2004/0157358 | A1 | 8/2004 | Hiramatsu et al. |
| 2005/0205903 | A1 | 9/2005 | Hioki |
| 2005/0224360 | A1 | 10/2005 | Varghese et al. |
| 2006/0024193 | A1 | 2/2006 | Zhao et al. |
| 2006/0088993 | A1 | 4/2006 | Zhang et al. |
| 2006/0138394 | A1 | 6/2006 | Den et al. |
| 2006/0269797 | A1 | 11/2006 | Lu et al. |
| 2007/0031639 | A1* | 2/2007 | Hsu et al. ............ 428/141 |
| 2007/0054421 | A1 | 3/2007 | Ueda et al. |
| 2007/0113530 | A1 | 5/2007 | Morozov et al. |
| 2007/0118939 | A1 | 5/2007 | Repetto et al. |
| 2007/0187238 | A1 | 8/2007 | Whalen, III et al. |
| 2007/0229817 | A1 | 10/2007 | Wang et al. |
| 2007/0235342 | A1 | 10/2007 | Matsuo et al. |
| 2007/0264749 | A1 | 11/2007 | Birkmeyer |
| 2008/0037173 | A1 | 2/2008 | Saito et al. |
| 2008/0047604 | A1 | 2/2008 | Korevaar et al. |
| 2008/0116168 | A1 | 5/2008 | Samper et al. |
| 2008/0218740 | A1 | 9/2008 | Williams et al. |
| 2008/0223794 | A1 | 9/2008 | Yamamichi et al. |
| 2008/0272421 | A1 | 11/2008 | Bhat |
| 2008/0274359 | A1* | 11/2008 | Lawrence ............ B01D 1/305 428/409 |
| 2009/0034122 | A1 | 2/2009 | Ichihara et al. |
| 2009/0045720 | A1 | 2/2009 | Lee et al. |
| 2009/0243584 | A1* | 10/2009 | Zhang et al. ............ 324/71.1 |
| 2009/0266418 | A1 | 10/2009 | Hu et al. |
| 2009/0297913 | A1 | 12/2009 | Zhang et al. |
| 2009/0311516 | A1 | 12/2009 | Wei |
| 2010/0033059 | A1 | 2/2010 | Choi et al. |
| 2010/0047523 | A1* | 2/2010 | Kim et al. ............ 428/144 |
| 2010/0066346 | A1 | 3/2010 | Zhang et al. |
| 2010/0108132 | A1 | 5/2010 | Tsakalakos et al. |
| 2010/0132772 | A1 | 6/2010 | Asano et al. |
| 2010/0269894 | A1 | 10/2010 | Misra et al. |
| 2010/0303722 | A1 | 12/2010 | Jin et al. |
| 2011/0012103 | A1 | 1/2011 | Yang et al. |
| 2011/0030382 | A1 | 2/2011 | Eadon et al. |
| 2011/0174069 | A1 | 7/2011 | Cornelius et al. |
| 2011/0240346 | A1 | 10/2011 | Kang et al. |
| 2011/0284381 | A1 | 11/2011 | Cabot et al. |
| 2011/0311800 | A1 | 12/2011 | Yamashita et al. |
| 2013/0161614 | A1 | 6/2013 | Tiwari et al. |

FOREIGN PATENT DOCUMENTS

| | | |
|---|---|---|
| JP | 05210245 | 8/1993 |
| JP | 08296060 | 11/1996 |
| JP | 10147898 | 6/1998 |
| JP | 2000035687 | 2/2000 |
| JP | 2003011099 | 1/2003 |
| JP | 2004098386 | 4/2004 |
| JP | 2004130171 | 4/2004 |
| JP | 2006520697 | 9/2006 |
| JP | 2006326723 | 12/2006 |
| JP | 2007098563 | 4/2007 |
| JP | 2008156705 | 7/2008 |
| JP | 2009037706 | 2/2009 |
| JP | 2009224146 | 10/2009 |
| KR | 100834896 | 4/2004 |
| WO | WO2009115230 | 9/2009 |

OTHER PUBLICATIONS

Mozalev, et al., "The growth and electrical transport properties of self-organized metal-oxide nanostructures formed by anodizing Ta—Al thin-film bilayers", Journal of Materials Science, 40, 2005, pp. 6399-6407.

Takahashi, et al., "Anodic film growth on Al layers and Ta-Al metal bilayers in citric acid electrolytes", Electrochimica Acta, 2005, p. 5065-5075.

Kiether, William Jay, "Application of Sculptured Thin Film Technology to Metal Oxide Gas Sensors," doctoral dissertation, 2007. Retrieved from http://repository.lib.ncsu.edu/ir/handle/1840.16/3698.

Fang, J. et al.; "Nanoimprinted SU-S Nanopillars and Hierarchically Branched Nanowires by Anodic Aluminum Oxide Templates and Their Optical Properties"; Conference Proceeding of Micro/Nano Symposium (UGIM) 2010 18th Biennial.

Furneaux, et al., "The Formation of Controlled-Porosity Membranes From Anodically Oxidized Aluminum", Nature, vol. 337, Jan. 12, 1989, pp. 147-149.

Kuo et al., "Sub-10nm Fabrication of Large Area Periodic Nanopillars", Mat. Res. Soc. Symp. Proc. vol. EXS-2 (2004), pp. M511.1-M511.3.

Kwon, J. T. et al.; "Simple Fabrication Method of Hierarchical Nano-Pillars Using Aluminum Anodizing Processes"; Current Applied Physics, Mar. 13, 2009, vol. 9 pp. e81-e85.

Lee, B.-K. et al.; "Fabrication of Polymer Micro/Nano-Hybrid Lens Array by Microstructured Anodic Aluminum Oxide CAAO) Mold"; Microelectronic Engineering; Dec. 9, 2008, vol. S6 pp. 857-860.

Mardilovich et al., "Electrochemical Fabrication of Nanodimensional Multilayer Films", Nano Letters (2005), vol. 5, No. 10, pp. 1899-1904.

Mardilovich, et al. "Hybrid Micromachining and Surface Microstructuring of Alumina Ceramic", Proc. Electrochem. Society, 2000-19, pp. 33-42.

Masuda et al., "Highly Ordered Nanochannel-Array Architecture in Anodic Alumina", Appl. Phys. Lett. 71 (19), Nov. 10, 1997, pp. 2770-2772.

Mozalev et al., "Nucleation and Growth of the Nanostructured Anodic Oxides on Tantalum and Niobium Under the Porous Alumina Film", Electrochimica Acta 48 (2003), pp. 3155-3170.

Mozalev et al., "Structure, Morphology, and Dielectric Properties of Nanocomposite Oxide Films Formed by Anodizing of Sputter-Deposited Ta—Al Bilayers", J of Electrochem Society, 151 (11), 2004 pp. F257-F268.

\* cited by examiner

NANO-STRUCTURE AND METHOD OF MAKING THE SAME

BACKGROUND

The present disclosure relates generally to nano-structures and methods of making nano-structures.

Porous anodic oxide structures may be used in a variety of applications including, for example, micro- and nano-electronics (such as, e.g., in planarized aluminum interconnections, precision thin-film resistors, thin-film capacitors, and nano-structured field-emission cathodes), electrostatic and thermo-activated switching devices, LC high-frequency oscillators, AC amplifiers, triggers and other logic vacuum integrated circuits (VICs), gas micro- and nano-sensors, micro- and nano-channel plates, mesoscopic engines, wavelength-sensitive filters, reflective and absorbing surfaces, membranes, nozzles, precision apertures, and/or like. These anodic oxide structures may also include one or more arrays of nano-pores that are used, for example, to form one or more arrays of nano-pillars formed on and supported by a substrate.

BRIEF DESCRIPTION OF THE DRAWINGS

Features and advantages of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 1A through 1E, 1G and 1H together schematically depict another embodiment of a method of forming another embodiment of a nano-structure;

FIGS. 1C-A, 1D-A, 1E-A, and 1G-A are enlarged views of a portion of the schematic depiction shown in FIGS. 1C, 1D, 1E, and 1G, respectively;

DETAILED DESCRIPTION

Figure 1A:
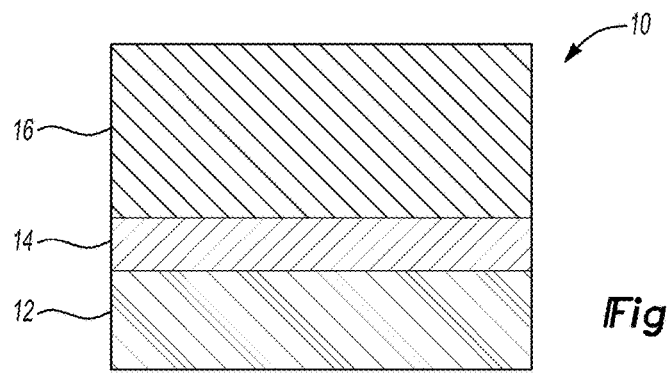
FIGS. 1A through 1F together schematically depict an embodiment of a method of forming an embodiment of a nano-structure.

Embodiment(s) of the nano-structure disclosed herein includes at least two sets of super nano-pillars. As used herein, the term "super nano-pillar" refers to a nano-pillar that is a fraction of the size (in terms of effective diameter) of a single larger nano-pillar, while a "set of super nano-pillars" refers to a discrete cluster (i.e., physically separated from another cluster) of super nano-pillars. As an illustrative example, one set is similar to a single larger nano-pillar that is split into a plurality of smaller super nano-pillars. In an example, each set includes from about 5 to about 10 nano-pillars. In another example, each set includes more than 10 nano-pillars (see, e.g., FIG. 5B). As such, the size of each super nano-pillar ranges from about $\frac{1}{5}$ to about $\frac{1}{10}$ of the size of the entire set (or of a single larger nano-pillar).

The sets of super nano-pillars may advantageously impart a shock absorbing property to the nano-structure such that the nano-structure may be used as a shock absorber, a substrate for a micro- and nano-sensor, active media for a micro- and nano-reactor (such as a lab-on-a-chip device), and/or the like. In many cases, devices made with or incorporating the nano-structure may be considered to be robust, at least in part because of the intrinsic flexibility of the nano-dimensional structures disclosed herein. This is due, at least in part, to the fact that the weakest part of the structure, i.e., the super nano-pillars, are built from amorphous oxide (i.e., no microcrystals with grain boundaries) and are built from the same material as the underlying support (i.e., no interfaces are present between the super nano-pillars and the underlying dense oxide). As such, when exposed to external forces (e.g., mechanical pressure) the super nano-pillars bend rather than break.

Further, the presence of the super nano-pillars in discrete sets in the nano-structure also advantageously increases the active surface area of the structure, as well as its mechanical flexibility. In some instances, the sets of super nano-pillars also impart at least some additional functionality to the nano-structure itself. For example, due, at least in part, to the significant curvature of their surface (i.e., diameter is very small), it is expected that enhanced surface energy and catalytic performance should be exhibited by the super nano-pillars disclosed herein.

Embodiments of the nano-structure disclosed herein may also be used as a superhydrophilic or superhydrophobic surface for a micro- and nano-fluidic device. As used herein, a "microfluidic device" refers to a device for capturing or separating micrometer-sized or smaller particulates within a fluid sample, whereas a "nanofluidic device" refers to a device for capturing or separating nanometer-sized or smaller particulates within a fluid sample. Examples of micro- or nano-fluidic devices include lab-on-a-chip devices, devices for the detection of an analyte, and devices for separating or sensing. In one embodiment, the device shown in FIG. 1H may be suitable for use as a separating or sensing unit.

Figure 1B:
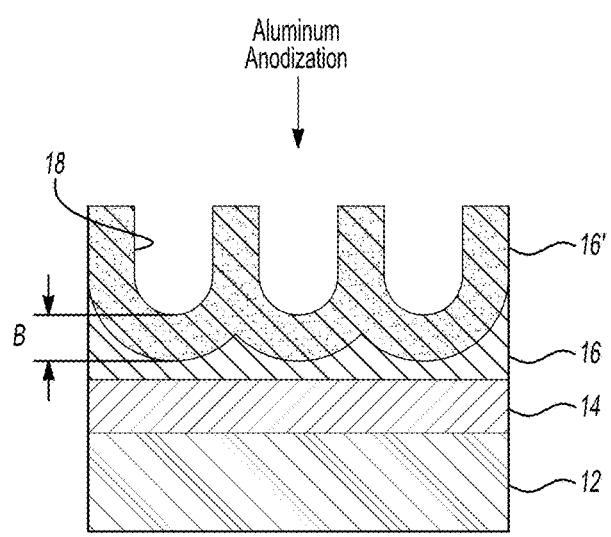
Figure 1C:
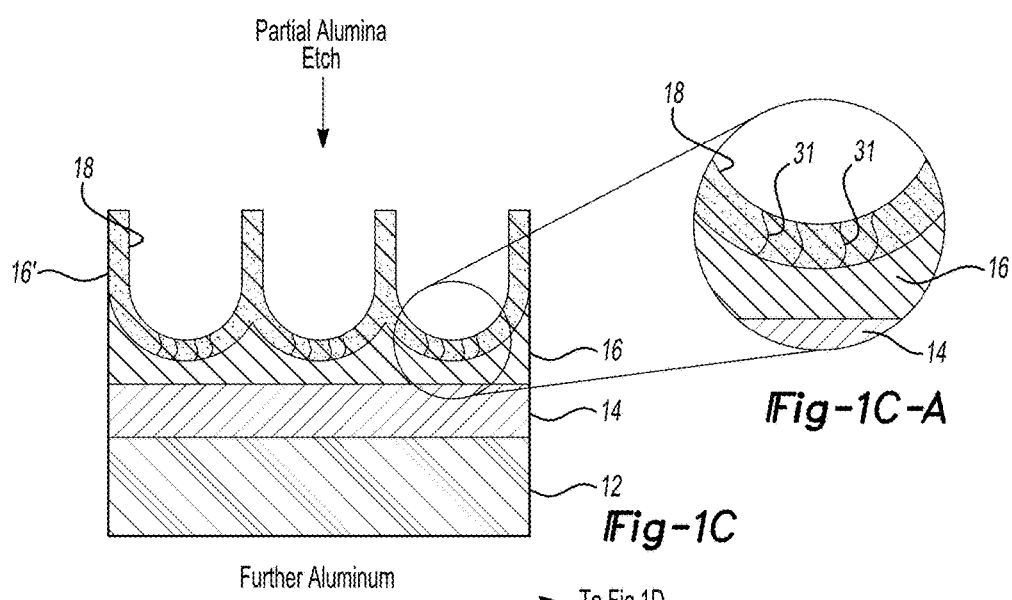
Figure 1D:
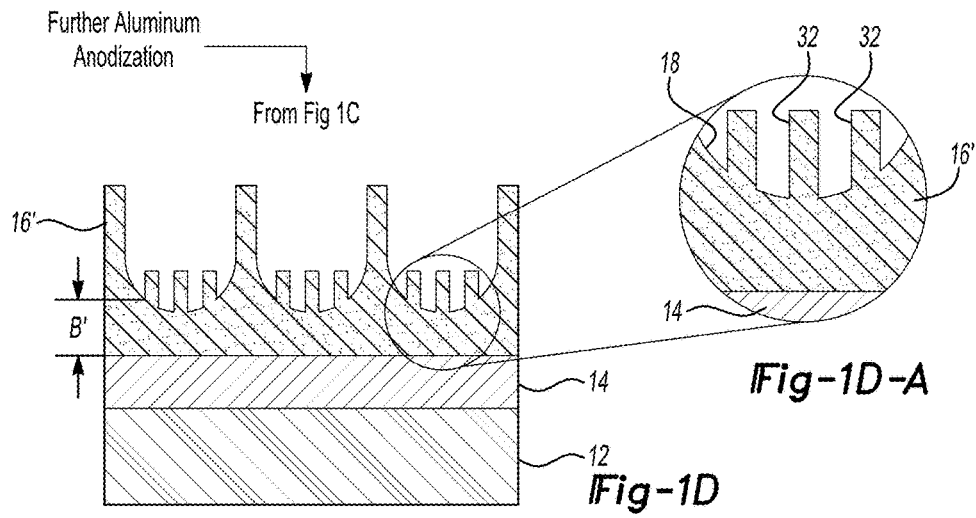
Figure 1E:
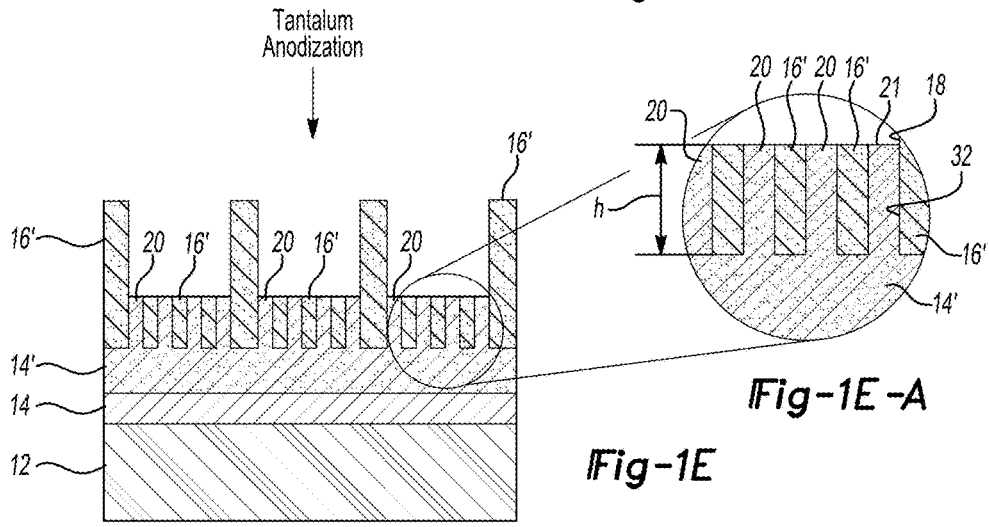
Figure 1F:
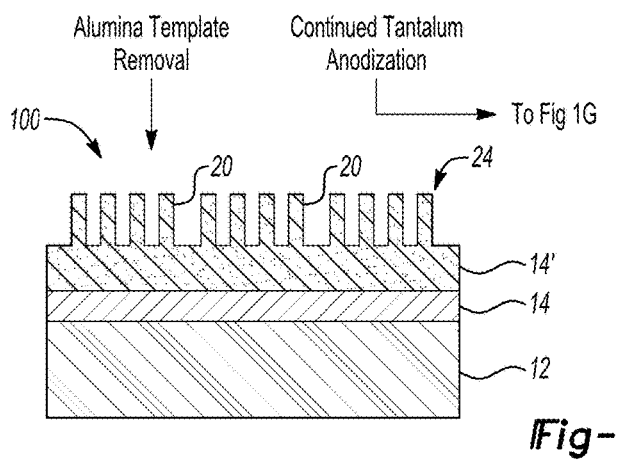

Referring now to the figures, one embodiment of the nano-structure 100 is schematically depicted in FIG. 1F, and the formation of this nano-structure 100 will be described below in conjunction with FIGS. 1A through 1F. Another embodiment of the nano-structure 100' is depicted in FIG. 1H, and the formation of this nano-structure 100' will be described below in conjunction with FIGS. 1A through 1E, 1G and 1H. While multiple sets 24, 24' of nano-pillars are shown in FIGS. 1F and 1H, it is to be understood that the method may be revised in order to form one set 24, 24' of nano-pillars or any desirable number of sets 24, 24' of nanopillars.

Further, as shown in FIGS. 1F and 1H, the nano-pillars 20 in each set 24, 24' of the nano-structure 100, 100' is positioned on an oxidized layer 14', which is formed from an oxidizable material layer 14 deposited on a substrate 12.

An embodiment of the method of forming the nano-structure 100 will now be described herein. Referring now to FIG. 1A, the method of forming the nano-structure 100 includes forming a multi-layered structure 10 that contains i) an oxidizable material layer 14 established on a substrate 12, and ii) another oxidizable material layer 16 established on the oxidizable material layer 14. The multi-layered structure 10 may be formed, for example, by depositing an oxidizable material on the substrate 12 to form the oxidizable material layer 14 having a thickness, and then depositing the other oxidizable material on the oxidizable material layer 14 to form the other oxidizable material layer 16, which also has a thickness. In one embodiment, the oxidizable material layer 14 is formed of a metal or metal alloy that forms a dense oxide after electrochemical oxidation, and the other oxidizable material layer 16 is formed of a metal or metal alloy that forms a porous oxide after electrochemical oxidation. Examples of suitable materials will be discussed further hereinbelow.

The layers 14, 16 have respective thicknesses that may be different or may be substantially the same. In one embodiment, the thickness of each of the layers 14, 16 is in the nanometer range. The layer 14 may have any suitable thickness that will produce (during electrochemical oxidation) enough oxide to form the nano-pillars 20 and, in some instances, the cap layer 22 formed over the nano-pillars 20 (which will be described in further detail below, see FIGS. 1G and 1H). In an example, the thickness of the oxide grown from the layer 14 (i.e., the structure 14', the nano-pillars 20, and, in some instances, the cap layer 22) is determined by multiplying the anodization voltage by an anodization coefficient (i.e., the number of nanometers that the oxide grows per one volt of anodization voltage). For instance, for a Ta layer 14, about 1.8 nm of $Ta_2O_5$ grows per volt of anodization voltage applied to the layer 14 to form a dense $Ta_2O_5$ film. In another instance, from about 1.3 nm to about 1.8 nm of $Ta_2O_5$ grows per volt of anodization voltage applied to the layer 14 to form nano-pillars with an underlying dense $Ta_2O_5$ film and with a dense $Ta_2O_5$ cap layer. In the latter instance (i.e., when the cap layer 22 is formed and there is a dense $Ta_2O_5$ film 14' beneath the nano-pillars 20), the anodization coefficient depends, at least, on the diameter of the paths (discussed below) in the template 16', the overall porosity of the template 16', the nature of the electrolyte used for Ta anodization, and the current density during Ta anodization.

The thickness of the Ta layer 14 should be thick enough to produce a $Ta_2O_5$ layer having any desired thickness and, in some cases, to maintain some of the Ta layer 14 on the substrate 12 underneath the formed super nano-pillars 20 and the dense portion of $Ta_2O_5$. For example, to produce a dense $Ta_2O_5$ layer with no nano-pillars, the total thickness of the Ta layer 14 may be calculated by i) multiplying the completed anodization voltage (i.e., the specific voltage at which the oxide thickness reaches a steady state value) by 1.8 nm of $Ta_2O_5$ growth per volt to determine the thickness of $Ta_2O_5$ that grows, and ii) then dividing that number by the expansion coefficient (i.e., the ratio of $Ta_2O_5$ to consumed Ta), which is 2.3. For instance, if an anodization voltage of 200 V is used for completing the Ta anodization and 1.8 nm of $Ta_2O_5$ grows per volt (which produces about 360 nm of $Ta_2O_5$), and the expansion coefficient is 2.3, then the thickness of the Ta layer 14 is about 160 nm. In instances where nano-pillars, with an underlying dense $Ta_2O_5$ film, are grown from the Ta layer 14 (with or without a cap layer), the thickness of the Ta layer 14 is based, at least in part, on the volume of $Ta_2O_5$ (which depends, at least in part, on the fraction of pillars in the entire stack, as well as their filling factor) and the anodization coefficient (which depends, at least in part, on the electrolyte used and the anodization conditions, and is from about 1.3 nm to about 1.8 nm per volt for tantalum).

The thickness of the layer 16, on the other hand, should be thick enough to form a template 16' (see FIG. 1B) that has a height that is greater than the height of the super nano-pillars 20 to be grown from the layer 14. In one example, the layer 16 has a thickness of 100 nm or less. In another example, the layer 16 has a thickness of 50 nm or less. In an example, the thickness of the template 16' is about the thickness of the layer 16 times the expansion coefficient (e.g., about 1.3, which is the ratio between the thickness of the porous anodic alumina and the thickness of the aluminum layer 16 consumed).

In an example, each of the layers 14, 16 are planar (e.g., are substantially flat and include, if any, a minimal amount of irregularities). In another example, one or more of the layers 14, 16 are non-planar. In this example, the non-planar layer(s) 14, 16 may also include a special morphology, features, structures, and/or the like that are etched into or other incorporated into the layers 14, 16. The planar or non-planar layers 14, 16 may be deposited on a planar or non-planar substrate 12, which will be described further below.

The deposition of the oxidizable material on the substrate 12 and the deposition of the other oxidizable material on the oxidizable material layer 14 may be accomplished using any suitable deposition technique known in the art. Some examples of suitable deposition techniques include physical vapor deposition (PVD) (such as, e.g., sputtering, thermal evaporation, and/or pulsed laser deposition), atomic layer deposition (ALD), or, in some instances, chemical vapor deposition (CVD).

The substrate 12 upon which the oxidizable material is deposited to form the layer 14 may be chosen based, at least in part, on the application for which the nano-structure 100 will ultimately be used. If, for example, the nano-structure 100 is to be used for semiconductor applications, the substrate 12 may be chosen from suitable support structures for semiconductors such as, e.g., a substantially planar silicon wafer. By "substantially planar", it is meant that the surface is flat but may contain some irregularities. In this example, the substrate 12 may have formed thereon a layer of insulating material (not shown) such as, e.g., silicon oxide or silicon nitride. The substrate 12 may also or otherwise be a non-planar structure, e.g., the substrate 12 may have a special morphology etched on or fabricated into the substrate 12. The substrate 12 may also be chosen from other materials such as, e.g., glass, quartz, alumina, stainless steel, plastic, and/or the like, and/or combinations thereof. In instances where the nano-structure 100 is used as a nano-filter, the substrate 12 may be chosen from a Si wafer with a thermally grown oxide (TOX) layer thereon, such as TOX/Si or $SiO_2$/Si. In an example, TOX/Si may be formed by oxidizing Si at a high temperature (i.e., from about 800° C. to about 1200° C.) using water vapor (steam) or molecular oxygen as the oxidant. In other words, TOX/Si may be formed via dry or wet oxidation, and the TOX/Si oxide layer may be referred to as a high temperature oxide layer. In some cases, a dry oxygen atmosphere produces a higher quality $SiO_2$, but the process itself is relatively slow. For thicker TOX/Si layers (i.e., a thickness of about 0.5 μm to about 4 μm or more), oxidation of the Si in a wet oxygen atmosphere is desirable. Other examples of suitable substrates include, but are not limited to, SiN, SiC, TEOS (which is $SiO_2$, but is prepared using a chemical vapor deposition (CVD) method from tetra-ethyloxy-silane (i.e., tetra-ethyl-ortho-silicate)), or the like.

The oxidizable material for the oxidizable material layer 14 is a conductor and may be chosen from a material that i) can be electrochemically oxidized and ii) has an expansion coefficient, during oxidation, that is more than 1. In some cases, the oxidizable material for the layer 14 may also or otherwise be thermally oxidized. Without being bound to any theory, it is believed that an expansion coefficient of more than 1 allows the oxidizable material to squeeze into the paths 32 of the template 16' (which will be described in further detail below). It is further believed that the height of the super nano-pillars 20 that are formed may, at least partially, be based on the expansion coefficient of the material in the layer 14. In an example, a super nano-pillar 20 height ranging from about 10 nm to 500 nm may be achieved when the expansion coefficient of the oxidizable material in layer 14 is more than 1. It is to be understood that the height of each of the super nano-pillars 20 (including the thickness of structure 14') may also be based, at least in part, on other factors including the anodization voltages used during the respective anodization of layers 16 and 14. Some examples of suitable oxidizable materials include tantalum (which has an expansion coefficient for thermal oxidation of 2.3, as mentioned above), titanium (which has an expansion coefficient for thermal oxidation of 1.7), niobium (which has an expansion coefficient for thermal oxidation of 2.7), and tungsten (which has an expansion coefficient for thermal oxidation of 3.3). It is to be understood that the expansion coefficient for thermal oxidation for each of the foregoing materials is substantially the same as that for electrochemical oxidation so long as the phase of each of these materials during oxidation is the same.

The other oxidizable material for the other oxidizable material layer 16 is also a conductor, but is chosen from a metal or metal alloy that, after electrochemical oxidation, produces a porous oxide. One example of the other oxidizable material includes aluminum or aluminum alloys, such as an aluminum alloy having aluminum as the main component. It is further to be understood that silicon, titanium, tantalum, niobium, and tungsten in the aluminum alloy may be present in small quantities such as, e.g., up to about 5%. It is believed that any porous material could be used for similar super nano-pillar fabrication if the etching of such material is accompanied by the creation of etching tracks 31 (see discussion of FIG. 1C).

The oxidizable material forming the oxidizable material layer 14 and the other oxidizable material forming the other oxidizable material layer 16 are substantially pure. As used herein, the term "substantially pure" refers to a material (such as a metal or a metal alloy) having a minimal amount, if any, impurities present therein. In an example, a substantially pure metal may be one that includes at least 95% of the metal. In some cases the substantially pure metal includes about 100% metal, and thus practically no impurities. In these cases, the metal may be referred to as a substantially pure metal, a pure metal, or just a metal. In an example, the substantially pure metal has at least about a 99.9% (e.g., often expressed as 3N), and in some cases at least about 99.99% purity (e.g., often expressed as 4N). It is to be understood that, in some instances, the oxidizable material and/or the other oxidizable material may be a metal alloy.

For purposes of illustration, the method depicted in the FIG. 1 series will be described using tantalum as the oxidizable material in the oxidizable material layer 14, and aluminum as the oxidizable material in the other oxidizable material layer 16. As such, in reference to FIGS. 1A through 1H, the layer 14 will be referred to as the tantalum layer 14, and layer 16 will be referred to as the aluminum layer 16. However, as previously noted, the layers 14 and 16 are not to be construed as being limited to being formed of tantalum and aluminum, respectively, but can be any of the oxidizable materials listed herein for the respective layers 14, 16.

Figure 2:
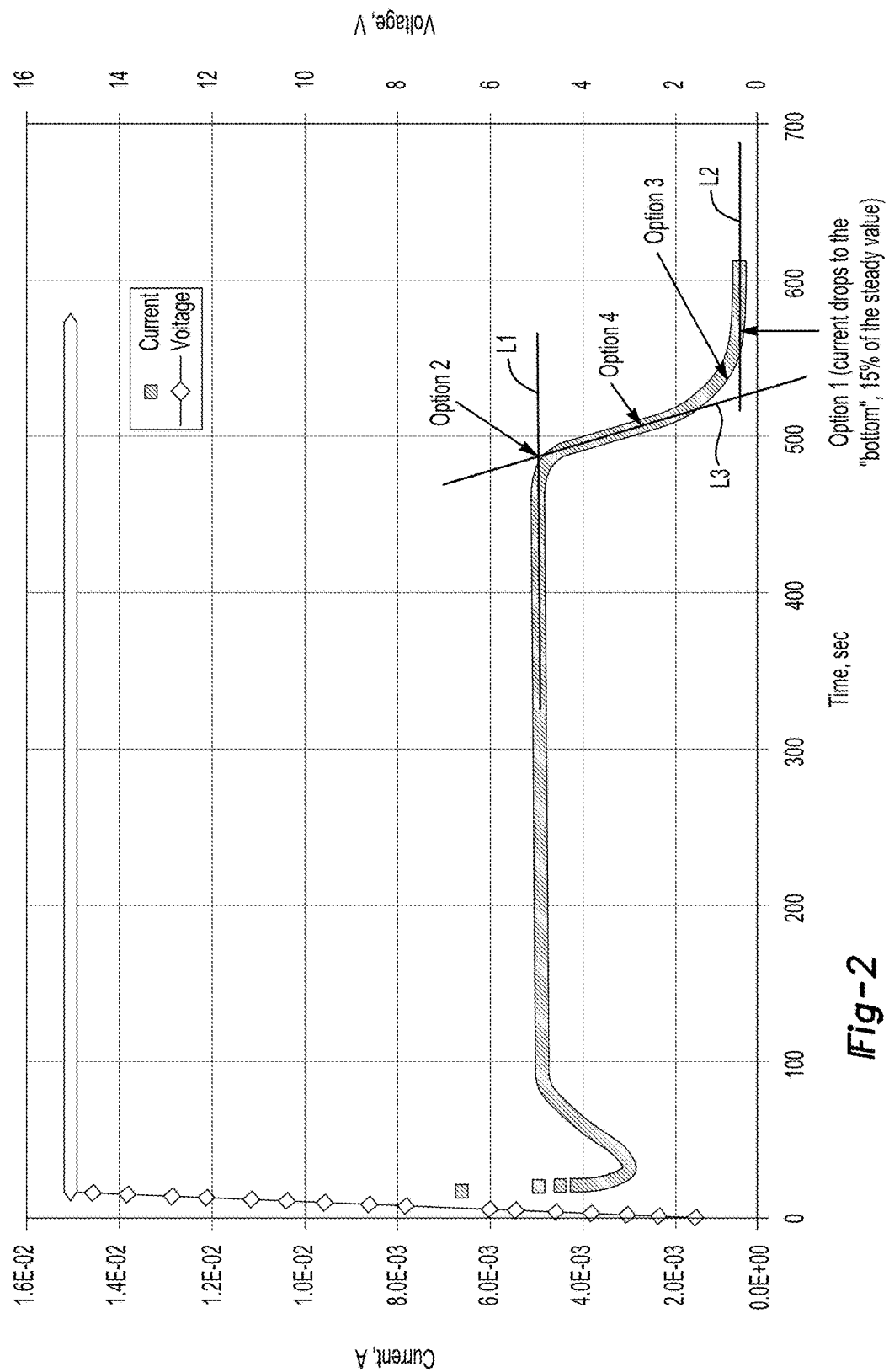
FIG. 2 is a graph showing a voltage and current dependency on anodization time for aluminum anodization.

After the multi-layered structure 10 is formed, a template 16' is formed by partial anodization of the aluminum layer 16 (as shown in FIG. 1B). In the embodiments disclosed herein, the template 16' is modified by other processes, including partial etching and additional anodization. As used herein, partial anodization refers to the oxidation of a part of the thickness of the layer being anodized. In an embodiment, the thickness of the aluminum layer 16 that is partially anodized to initially form the template 16' (as shown in FIG. 1B) is determined by determining an amount of anodization time needed to completely anodize (i.e., to fully oxidize the layer), and then performing anodization for some time less than the amount of time needed to completely anodize. As such, the amount of time to partially anodize the layer 16 is estimated from the amount of time that will completely anodize the layer 16. In an example, the amount of anodization time needed to completely anodize the aluminum layer 16 (which may be referred to herein as "time zero") is estimated by analyzing a dependency of anodization voltage and current density on an anodization time of the aluminum layer 16, as shown in the graph in FIG. 2. In the example shown in FIG. 2, the layer 16 was a 300 nm thick aluminum layer and the layer 14 was a 50 nm thick tantalum layer. The anodization area was 3 $cm^2$, the electrolyte was 4% wt. % oxalic acid, and the cathode was 4N Al. Anodization was performed in potentiostatic regime, with the voltage being 15V. It is to be understood that if different conditions are utilized (e.g., Al thickness, electrolyte, etc.), the numbers will be different. As shown in FIG. 2, in this example, the current density begins to drop at about 480 seconds of anodization time of the layer 16, and continues to drop until about 550 seconds of anodization time. At about 550 seconds, the current drops to a steady state value, and anodization of the layer 16 is considered to be complete. Several options may be used to estimate time zero from the graph of FIG. 2. For instance, time zero may be when the aluminum layer 16 is completely anodized (e.g., at 15% of the steady state anodization current, which occurs at about 550 seconds, as identified by option 1 in the graph), or at various times prior but close to complete anodization of the aluminum layer 16, which are easy to estimate based on the experimental data (e.g., at 480 seconds, 510 seconds, or 540 seconds, which are options 2, 3, and 4 shown in the graph, respectively).

It may be difficult to identify the exact time at which the current begins to decrease, and thus the time may be estimated at plus or minus 5 to 10 seconds. The options shown in FIG. 2 are the result of extrapolations. The best fit line L1 is associated with the region between about 100 seconds and about 450 seconds, the best fit line L2 is associated with the region between about 550 seconds and about 600 seconds, and the best fit line L3 is associated with the region between about 490 seconds and about 540 seconds. The options at the intersections between the best fit lines L1 and L3 (i.e., option 2) and L2 and L3 (option 3) are more precise in terms of process duration than option 1. Option 4 represents half the distance between options 2 and 3. When the minimal current that can be obtained for the system is known and anodization current can be observed throughout the process, then option 4 can be readily calculated. For example, if anodization is taking place at 5 mA and the final current is 0.5 mA, option 4 will be when the current drops down to 2.75 mA [(5−0.5)/2+0.5]. In order to stop in advance of this calculated complete anodization, it may be desirable to run test experiments, estimate the durations of each region, and calculate a desired stop time.

The template 16', shown in FIG. 1B, is formed by partially anodizing the aluminum layer 16 using an amount of anodization time determined from the graph in FIG. 2. In an example, partial anodization of the layer 16 is accomplished for less than 480 seconds. It is to be understood that enough of the aluminum layer 16 is anodized to form the desired template 16', which includes a plurality of pores 18 defined therein and a barrier layer B of alumina that defines the bottom of each pore 18. As illustrated in FIG. 1B, after template 16' formation, there is some remaining non-anodized aluminum 16. Partial anodization of the aluminum layer 16 to form the template 16' may be accomplished by employing the aluminum layer 16 as the anode of an electrolytic cell and selecting at least one of $H_2SO_4$ (sulfuric acid), $H_3PO_4$ (phosphoric acid), $C_2H_2O_4$ (oxalic acid), or $H_2CrO_4$ (chromic acid) as the electrolyte. The electrolyte may be present in a water based solution. These electrolytes form porous alumina rather than dense alumina. In one embodiment where the electrolyte is oxalic acid ($C_2H_2O_4$), the electrolyte may be present, in solution with water, at a wt % ranging from about 1 wt % to about 5 wt %. In another embodiment where the electrolyte is sulfuric acid ($H_2SO_4$), the electrolyte may be present, in solution with water, at a vol % ranging from about 5 vol % to about 40 vol %. In some instances, certain additives (e.g., an alcohol, a surfactant, etc.) may also be added to the electrolyte solution. It is to be understood that the concentration of electrolyte in solution and the other conditions may vary as long as they are suitable for porous anodization (i.e., the formation of the porous template 16'). Any suitable cathode may be used, for example, aluminum or platinum (e.g., foil or mesh). A suitable amount of voltage and current is then applied to the electrolytic cell for an amount of time to partially anodize the aluminum layer 16 (i.e., where the anodized portion of the aluminum layer 16 is oxidized). The anodization of the aluminum layer 16 forms porous anodic aluminum oxide (i.e., porous anodic alumina), and allows the alumina to grow to a desired thickness.

Figure 3A:
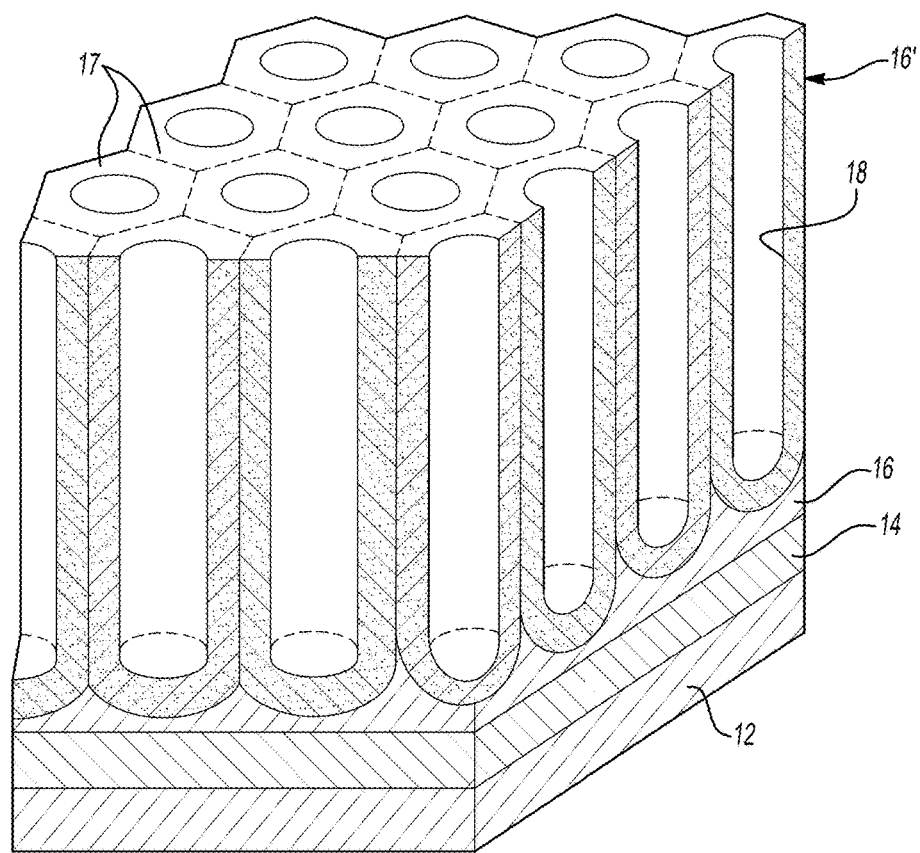
FIG. 3A is a schematic three-dimensional representation of the porous anodic alumina template of FIG. 1B.
Figure 3B:
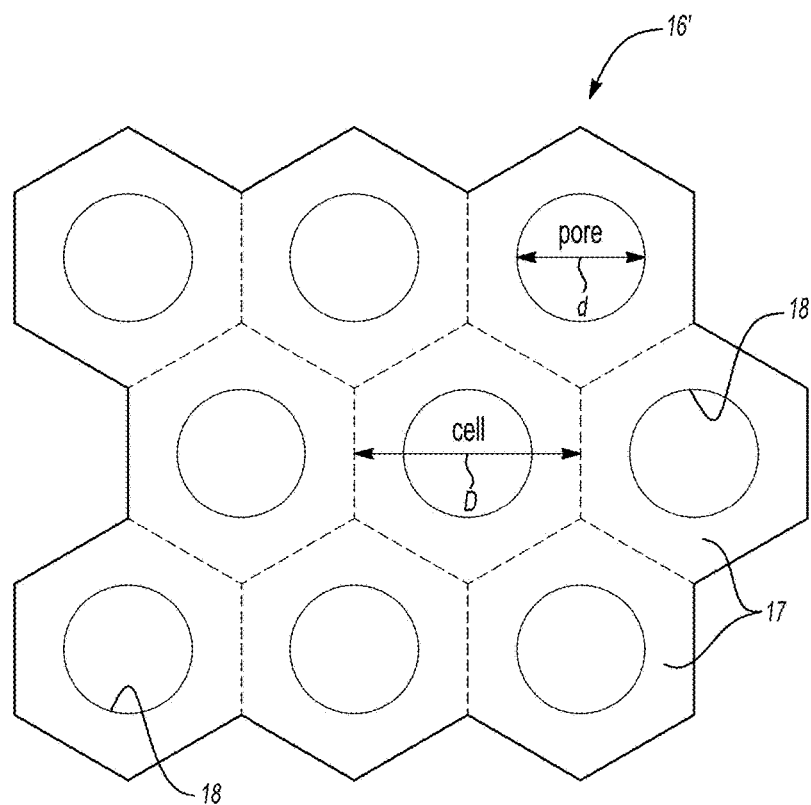
FIG. 3B is a top view of the example of the anodic alumina template of FIG. 3A.
Figure 3C:
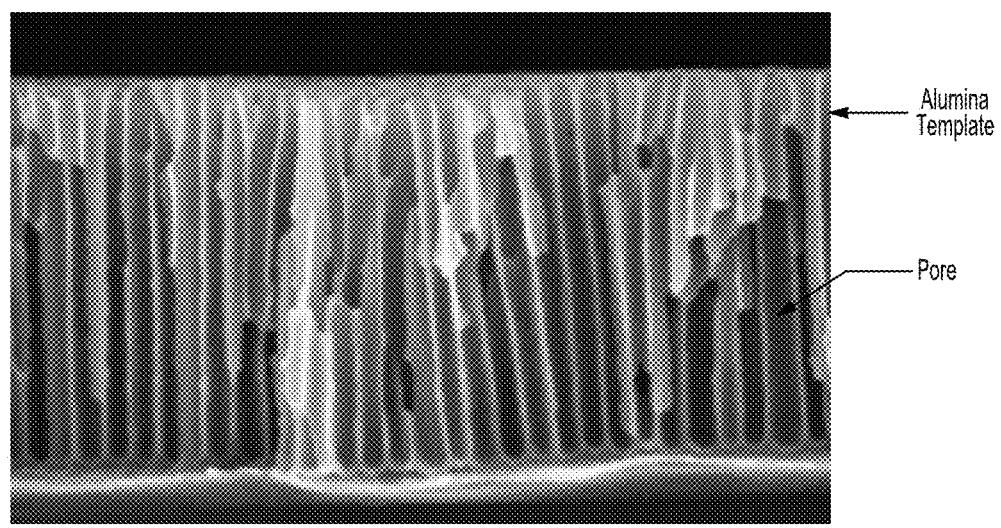
FIG. 3C is a scanning electron micrograph (SEM) image showing a cross-section of an anodic alumina template after about 30 minutes of etching.

The porous template 16' is shown in FIGS. 1B (cross-sectional view), 3A (perspective view), and 3B (top view), and 3C (a SEM image of a cross section of the template 16'). It is to be understood that the pores 18 at this point in the process do not extend through to and expose the underlying tantalum layer 14. The template 16' includes a plurality of cells 17 (see FIGS. 3A and 3B) each having a pore 18 defined therein. In an example, each of the pores 18 defined in the template 16' is oriented substantially normal to the substrate 12 surface. The size of the pores 18 formed during anodization may be controlled through the selection of the electrolyte and the anodization conditions. For instance, for an alumina template, the diameter D of a cell 17 is about 2.8 nm per volt (e.g., when Al is used for layer 16), and the diameter d of the pore 18 depends on the electrolyte and the current density. In one embodiment, the diameter d of the pore 18 is proportional to the voltage used. The ratio of the cell diameter and the pore diameter (D/d) is, for example, 3.3 for a $H_2CrO_4$ electrolyte, 4.9 for a $H_2SO_4$ electrolyte, 3.0 for a $H_2C_2O_4$ electrolyte, and between 1.7 and 2.1 for a $H_3PO_4$ electrolyte. As examples, pores of the following sizes may be obtained using the following electrolytes: pores having about 20 nm diameters may be obtained using $H_2SO_4$ as the electrolyte, pores having about 40 nm diameters may be obtained using $C_2H_2O_4$ as the electrolyte, and pores having about 120 nm may be obtained using $H_3PO_4$ as the electrolyte.

In another embodiment, prior to performing anodization, the method includes patterning the aluminum layer 16. Patterning may be accomplished via any suitable technique, and is used to perform localized anodization of the aluminum layer 16. Any standard photolithography method may be utilized. One example of patterning with standard photolithography includes depositing a hard mask material (e.g., $Si_xN_y$ such as SiN or $Si_3N_4$) on the aluminum layer 16, and then using a photoresist to pattern the $Si_xN_y$ material to allow localized exposure of aluminum. In an example, the mask is patterned to expose portion(s) of the aluminum to the electrolyte. In some cases, the aluminum may also be patterned and etched to produce clusters of aluminum (i.e., formed when areas of aluminum are etched, but the Ta is still present). In other cases, aluminum and tantalum are patterned and etched to produce clusters of aluminum/tantalum. In this example, the interface formed between the mask and the aluminum layer 16 is robust, which advantageously prevents separation of the layers during anodization. In one embodiment, the areas that remain exposed once the mask and photoresist are in position are subject to local anodization. The aluminum layer exposed via the patterned mask or the patterned aluminum layer (not shown) is then locally anodized, for example, by employing the exposed or patterned aluminum layer as the anode of an electrolytic cell, and employing any suitable cathode, such as aluminum (having a 99.99% purity) and/or platinum (foil or mesh). The electrolyte may be selected from any electrolyte that will suitably allow the formation of porous alumina. Some examples of the electrolyte include solutions of $H_2SO_4$, $H_3PO_4$, $H_2C_2O_4$, and/or $H_2CrO_4$. A suitable voltage and current is then applied to the electrolytic cell for an amount of time to partially anodize the patterned aluminum layer. The combination of patterning and anodization forms a porous anodic alumina template 16' with specific dimensions.

Figure 4:
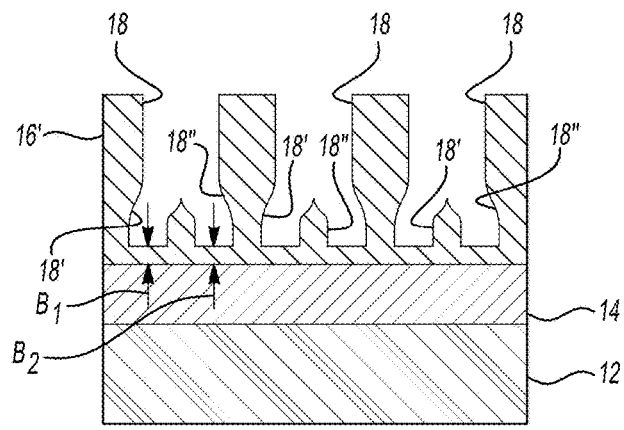
FIG. 4 is a schematic depiction of an embodiment of a template having secondary pores formed in pores.

In one example, the anodization of the aluminum layer 16 may be accomplished via a potentiostatic regime, whereby a constant anodization voltage is applied. Due at least in part to the pore diameter being proportional to voltage, anodization using a constant voltage produces pores having a substantially constant diameter from top to bottom. In another example, the anodization may be accomplished via a galvanostatic regime, whereby a constant current density is applied, and thus a constant rate of anodization is achieved. In one example, the voltage may vary during the anodization, which produces pores 18 having a varying diameter from top to bottom. Varying the voltage during template 16' formation may also lead to the formation of secondary pores 18', 18". The formation of secondary pores 18', 18" is shown in FIG. 4. The initial anodization voltage may be decreased to create one or more new substantially parallel pores 18', 18" per every initial pore 18. The number of secondary pores 18', 18" may be readily controlled via the anodization voltage. All of these secondary pores 18', 18" will have respective barrier layers $B_1$, $B_2$ that are equivalent to each other, but are smaller than the barrier layer B of the pore 18 due to the proportionality to the anodization voltage at the final stage (1.3 nm per volt). When forming secondary pores 18', 18", it is to be understood that the electrolyte may be changed from the electrolyte used to form the pore 18.

When secondary pores 18', 18" are formed in the template 16', it is to be understood that the process will continue with the anisotropic etching, continued aluminum anodization, tantalum anodization, and template 16' removal as described further hereinbelow. These processes will form tracks 31 and paths 32 (described further hereinbelow) beneath each of the secondary pores 18, 18". It is to be further understood that when secondary pores 18', 18" are formed in the template 16', the tracks 31 and paths 32 will be formed in the barrier layers $B_1$, $B_2$ such that super nano-pillars 20 are formed adjacent (in one embodiment, below) each secondary pore 18', 18".

Referring now to, and as illustrated in, FIG. 1C, embodiments of the method further include partially etching the template 16'. Partial etching may be accomplished via anisotropic etching, which further defines the pores 18 and modifies the template 16'. Anisotropic etching allows control over the size of the pores 18. This etching process further defines the already formed pores 18, and in many instances increases the diameter of the formed pores 18. This etching process also dissolves some of the alumina at the bottom of each pore 18 to form tracks 31 therein (see FIG. 1C-A for an enlarged view of the tracks 31). A track is a weakened portion of the alumina 16', where the alumina 16' starts to dissolve. It is believed that tracks 31 form when protons diffuse into the alumina, which initiates alumina dissolution. As such, the tracks 31 may be more predominate at the surfaces directly exposed to the etching process. Additionally, it is believed that the track 31 that is formed may be different depending upon the electrolyte used during the first anodization step. For example, an $H_2CrO_4$ electrolyte forms an oxide that has a relatively small concentration of incorporated electrolyte ions. This may affect the configuration of the tracks 31 when protons are diffused into the alumina 16' during etching. It is to be understood that while not shown in FIG. 2C, tracks 31 may form in other portions of the template 16' as well.

Anisotropic etching may be performed using diluted phosphoric acid (5 vol. %) or a solution of sulfuric acid (20 vol. %). It is also believed that a diluted form of a hydroxide such as, e.g., NaOH or KOH may be used for etching. The time for etching may vary, depending, at least in part, upon the desirable average diameter for the final pores 18, the desired height of the super nano-pillars 20 to be formed, the etchant used and its concentration, and/or the etching temperature. In an embodiment, the anisotropic etching time ranges from about 15 minutes to about 45 minutes in instances where anisotropic etching is performed using a diluted phosphoric acid (5 vol. %) at about 30° C. In this embodiment, the etching time may be up to, in one example, about 30 minutes, or may be less than 15 minutes (e.g., 5 minutes). The duration of anisotropic etching will contribute to how large an area will be covered by a set 24, 24' of super nano-pillars 20, to how large the gap between adjacent sets 24, 24' of super nano-pillars 20 will be, the filling factor (pillar density), and in some instances, the height of the super nano-pillars 20.

The temperature for etching may also depend upon the process and etchant used. In one embodiment, the etchant temperature ranges from about 0° C. to about 100° C. depending, at least in part, on the type of etchant used. In an example, the etchant temperature ranges from about 20° C. to about 40° C., for example, when a diluted phosphoric acid etchant is used.

As shown in FIGS. 1D and 1D-A, a second aluminum layer anodization is performed to complete the anodization of the remaining aluminum layer 16 (i.e., the aluminum that was not anodized to form the template 16' shown in FIG. 1B). This second aluminum layer anodization step oxidizes the remaining aluminum layer 16 through to the tantalum layer 14, and thus introduces another barrier layer B' to the template 16'. When the last remaining portions of the aluminum layer 16 are anodized, these portions become alumina. As the anodization process continues, all of the aluminum is consumed and thus complete aluminum anodization is achieved. This second aluminum layer anodization step also forms paths 32 in the template 16' where the tracks 31 were formed during etching. During this anodization process, it is believed that field assisted dissolving opens up the tracks 31 to form the paths 32.

In one embodiment not shown in the drawings, the aluminum anodization process of FIG. 1D may be continued in the electrolyte (e.g., oxalic acid) that etches away the portion of the barrier layer B' making up the bottom of the paths 32 by field assisted dissolving. Once the paths 32 are opened through to the underlying tantalum layer 14, the electrolyte may be switched to one that will form a dense oxide from the layer 14. These electrolytes may be selected from citric acid ($C_6H_8O_7$), boric acid ($H_3BO_3$), ammonium pentaborate (($NH_4)_2B_{10}O_{16} \times 8H_2O$), ammonium tartrate ($H_4NO_2CCH(OH)CH(OH)CO_2NH_4$), mixtures thereof, or another suitable electrolyte. This electrolyte will be used in a tantalum anodization process that forms a dense tantalum pentoxide layer 14' that will ultimately grow to form the nano-pillars 20 through the open paths 32.

Referring back to the embodiment shown in FIGS. 1D and 1E, either anodization is continued or another anodization current and voltage is applied to initiate a plurality of steps that lead to the formation of tantalum pentoxide nano-pillars 20. In one embodiment, the initial and continued anodization of layer 14 is accomplished by employing the tantalum layer 14 as the anode of an electrolytic cell and employing platinum, stainless steel, or any other appropriate material as the cathode, and applying a suitable anodization voltage and/or current density to initiate the various processes described herein.

It is to be understood that in the embodiment shown in the figures, when the layer 14 starts to oxidize, the anodic alumina barrier B' is still present. This alumina barrier layer B' is a dielectric layer between the electrolyte and the metal (in this case, tantalum). During initial tantalum layer 14 anodization, at least the portion of the barrier layer B' making up the bottom of the paths 32 is etched away by field assisted dissolving. This dissolution occurs when the electrolyte used is the same kind of electrolyte used for porous anodization of layer 16. For example, dissolution will occur when oxalic acid (i.e., $H_2C_2O_4$) (or any of the other electrolytes used to form porous alumina) is used as the electrolyte. Dissolution opens up the paths 32 to enable growth of tantalum pentoxide super nano-pillars 20 therein. This is shown in FIGS. 1E and 1E-A. It is believed that field assisted etching is taking place on the bottom of any pore 18, where the distance between the layer 14 and the electrolyte is the shortest. This etching process is faster than, e.g., chemical etching and thus readily opens up the paths 32.

After the paths 32 are formed, they may be subjected to further etching in order to increase the diameter. This additional etching process may be any chemical etching process.

As the anodization of the oxidizable material layer 14 (in this example the tantalum layer 14) continues, the oxidized form of the tantalum (i.e., tantalum pentoxide structure 14') grows through the individual paths 32 defined in the pores 18 of the template 16' to form a plurality of super nanopillars 20. It is to be understood that the volume of the tantalum pentoxide that grows during the anodization of the tantalum layer 14 should exceed the volume of the tantalum from which the oxide is formed so that the oxide squeezes into the paths 32. Tantalum anodization is continued at least until the nano-pillars 20 are formed in the paths 32. One super nano-pillar 20 is formed in each path 32, as shown in FIGS. 1E-A and 1E-A.

In one embodiment, the tantalum layer 14 is anodized at an appropriate anodization voltage and/or current density for an amount of time sufficient for the tantalum pentoxide super nano-pillars 20 to grow, inside their respective paths 32 defined in the pores 18, up to a predetermined height h (see FIG. 1E-A). In an example, the tantalum pentoxide super nano-pillars 20 grow until each super nano-pillar 20 has substantially the same predefined height h that terminates at an end 21 (as shown in FIG. 1E-A). In the embodiment shown in FIG. 1E-A, the height h of the nano-pillars 20 is equivalent to (or in other embodiments shorter than) a height of the paths 32 within which the super nano-pillars 20 are grown. In one embodiment, as soon as the super nano-pillars 20 are grown to the predetermined height h, anodization is stopped.

The orientation of the super nano-pillars 20 is generally controlled by the orientation of the paths 32. In the embodiments of the method depicted in the FIG. 1 series, the super nano-pillars 20 are oriented in a position that is substantially normal to the substrate 12. When the super nano-pillars 20 grow during the oxidizable material anodization, the geometry and/or dimensions of the super nano-pillars 20 will conform to that of the paths 32 within which the super nano-pillars 20 are growing. The dimensions of the template 16' (and the paths 32) may be controlled by the nature of the electrolyte selected, the electrolyte concentration, the temperature of aluminum anodization, the current density, the anodization voltage, duration of the etching process that is performed, and/or the completeness of the anodization process.

Tantalum anodization also forms the dense oxide structure 14' beneath the template 16'. As anodization continues, both the interface between the oxidizable material layer 14 and the formed anodic oxide (i.e., oxide structure) 14' and the interface between the anodic oxide 14' and the electrolyte (not shown) are planarized. The affect of planarization at the interfaces is shown in FIG. 1E.

The oxidized form of the tantalum formed during the anodization of the tantalum layer 14 is a substantially pure oxide. As used herein, a "substantially pure oxide" refers to an oxide that may include some impurities. Typically, dense oxides (such as the structure 14') have a smaller amount of impurities as compared to porous oxides (such as the template 16'). In one embodiment, the dense oxide includes a small portion of the alumina (or other material forming the template 16') and/or of the electrolyte. In one embodiment, the porous alumina template 16' may have up to about 15 wt % or up to about 18 wt % of electrolyte ions incorporated and/or absorbed/adsorbed therein.

After the super nano-pillars 20 are grown to the desirable height h, two different processes may occur. In one embodiment, anodization stops, and the entire structure (i.e., the multi-layered stack) is removed from the electrolytic cell and the alumina template 16' is removed (see FIG. 1F). In another embodiment, anodization is continued (see FIG. 1G).

Referring now to FIG. 1F, after the super nano-pillars 20 are grown, the template 16' is removed to form the nano-structure 100. In an example, the template 16' is removed using a selective etching process that will remove the anodic alumina template 16' without deleteriously affecting the other features (e.g., 14', 20). Selective etching may be accomplished using an etchant solution (such as, e.g., $H_3PO_4$—$CrO_3$—$H_2O$) solution) at a temperature ranging from about 80° C. to about 95° C. It is to be understood that etching may also be accomplished at a temperature outside of the foregoing range, but the duration of the etching may be affected. For instance, at a temperature lower than 80° C., the duration of the etching may be longer. In some cases, etching may also be accomplished at temperatures as high as the boiling point of the solution (such as, e.g., about 100° C.). In this embodiment, $H_3PO_4$ etches the alumina and the $CrO_3$ passivates aluminum etching (this is particularly desirable when working with patterned aluminum and localized alumina). In one example, the etchant solution includes about 92 g of $H_3PO_4$, about 32 g of $CrO_3$, and about 200 g of $H_2O$, although it is to be understood that the components of the etchant may vary. It has been found that the nano-pillars 20 can withstand this particular etching process for more than one hour, while the anodic alumina template 16' is etched away at a rate of about 1 micron per minute. Other etching solutions that may be used include hydroxide solutions such as, e.g., NaOH, KOH, etc. The alumina template 16' may also be etched using a 5% $H_3PO_4$ solution at 30° C., $H_2SO_4$, etc. Etching may be accomplished, if desired and/or required, in a lateral direction to a distance of about 100 μm, and in some instances even further.

The nano-structure 100 formed via the method of FIGS. 1A through 1F is shown in FIG. 1F. This embodiment of the nano-structure 100 includes three sets 24 of free standing super nano-pillars 20 where each set 24 is positioned a spaced distance from each other set 24. The spaced distance is dictated by the template 16', which is now removed. In one embodiment, the free-standing super nano-pillars 20 can bend and absorb energy of acoustic waves. In another embodiment, the free-standing nano-pillars 20 may be used, due in part to the high surface area, as a substrate for the deposition of catalytically active ingredients and for sensing.

Figure 1G:
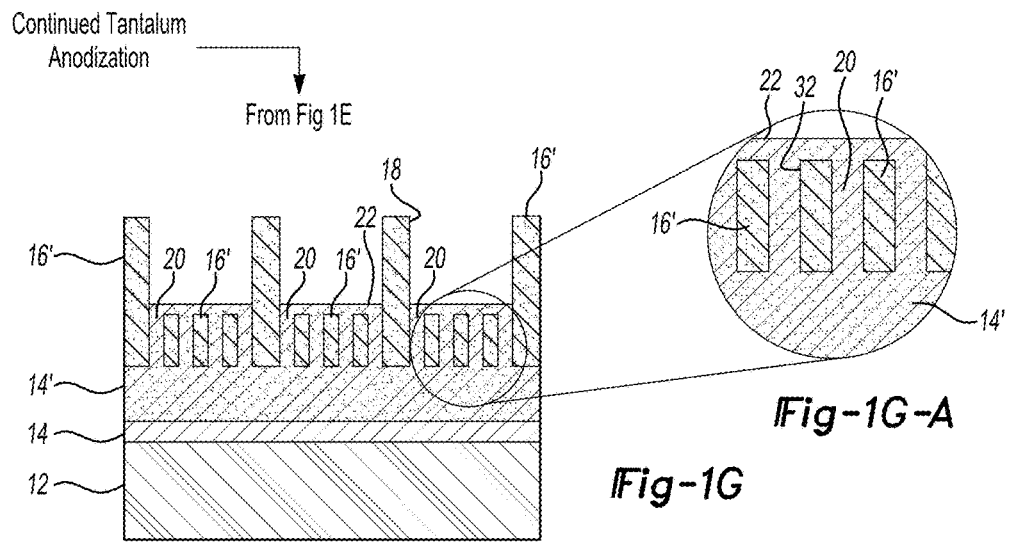
Figure 1H:
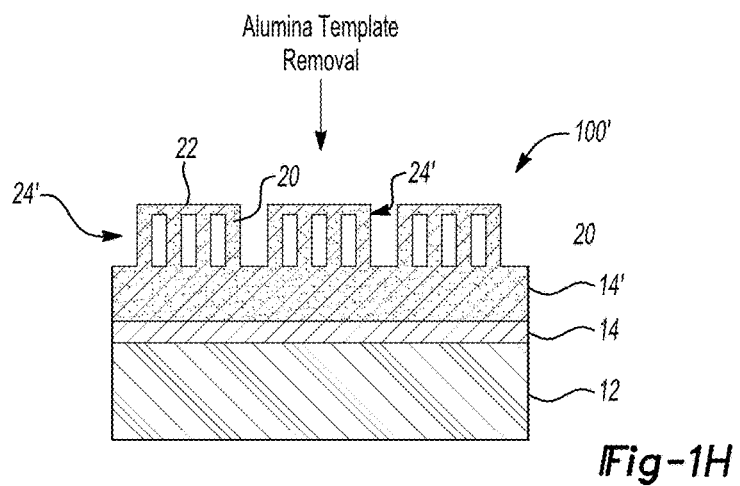

Referring now to FIGS. 1G and 1G-A, the tantalum layer 14 anodization continues at an appropriate anodization voltage and/or current density for an amount of time sufficient for the tantalum pentoxide super nano-pillars 20 to grow through the entire thickness or height of their respective paths 32. When the tantalum pentoxide super nano-pillars 20 reach the top of the portion of the template 16' defining the paths 32, the tantalum pentoxide continues to grow over these portions of the template 16'. More specifically, upon reaching the top of the paths 32, the tantalum pentoxide of one super nano-pillar 20 spreads over the top of the template portions 16' and merges with the tantalum pentoxide of an adjacent super nano-pillar 20. The spreading of the tantalum pentoxide from the super nano-pillars 20 occurs in all directions so that a dense cap layer 22 can be formed over the pillars 20 and over the portions of the template 16' defining the paths 32. In other words, the respective ends 21 (see FIG. 1E-A) of the super nano-pillars 20 continue to grow, and ultimately spread across the surface of the portions of the template 16' and merge together to form a substantially continuous cap layer 22 (i.e., a cap layer 22 that is absent of, or includes a very small number of holes, gaps, or the like).

The cap layer 22 has a thickness that is controllable by the anodization of the tantalum layer 14. In one example, the thickness increases as the anodization voltage increases. In many cases, the total mass of the nano-structure 100' (see FIG. 1H) may be controlled by adjusting the thickness of the cap layer 22 or a lateral area of the cap layer 22. In an example, the cap layer 22 should be thick enough so that the cap layer 22 is dense. It is to be understood that the cap layer 22 may be formed whenever there is enough of layer 14 and the voltage is high enough to grow the oxide 14' through and out of the paths 32. In one embodiment, formation of the cap layer 22 consumes any remaining layer 14.

After the cap layer 22 has been formed, the template 16' may be removed using any of the embodiments of the template 16' removal process described above. The resultant nano-structure 100' is shown in FIG. 1H, where each set 24' of super nano-pillars 20 has a cap layer 22 thereon.

It is to be understood that, in some cases, it may be desirable to modify the surface chemistry of the super nano-pillars 20 and/or the cap layer 22, for example, to improve the chemical robustness of the nano-structure 100, 100', to tune the contact angle of these surfaces in order to improve wettability or to stop wetting, to change the acidity of zeta potential of these surfaces so that the surfaces may have a different affinity to different chemicals, etc. Modification of the surface chemistry may be accomplished, for example, by depositing a material on a surface of the super nano-pillars 20 and/or the cap layer 22. Deposition of the material may be accomplished, for example, by atomic layer deposition, chemical vapor deposition, metal organic chemical vapor deposition (MOCVD), electrochemical deposition, and/or the like. In an example, the material may be conformally deposited over the entire surface of the selected nano-pillars 20 and/or the cap layer 22 at a thickness ranging from about 4 nm to about 8 nm. In another example, the thickness of the deposited layer is about 6 nm. Some examples of the materials that may be deposited on the nano-pillars 20 and/or the cap layer 22 include aluminum oxide, zirconium oxide, titanium oxide, silicon dioxide, tungsten oxide, zinc oxide, hafnium oxide, or combinations thereof.

To further illustrate embodiment(s) of the present disclosure, examples are given herein. It is to be understood that these examples are provided for illustrative purposes and are not to be construed as limiting the scope of the disclosed embodiment(s).

EXAMPLES

Example 1

Figure 5A:
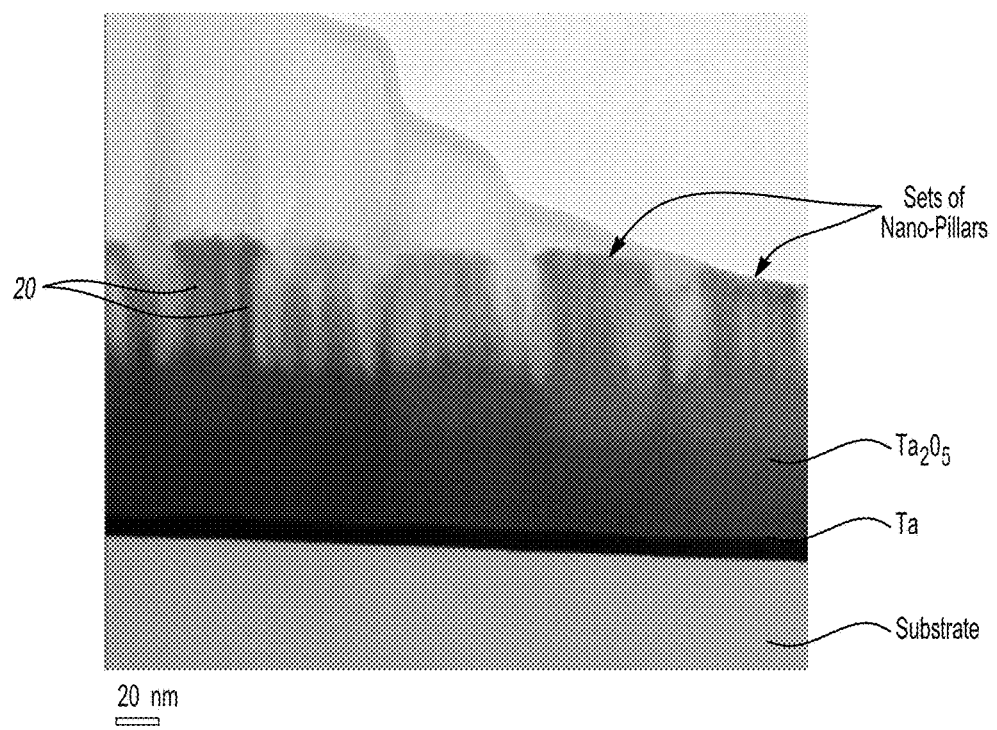
FIG. 5A is a transmission electron micrograph (TEM) image of a cross-section of the nano-structure formed using the embodiment of the method shown in FIGS. 1A through 1F.
Figure 5B:
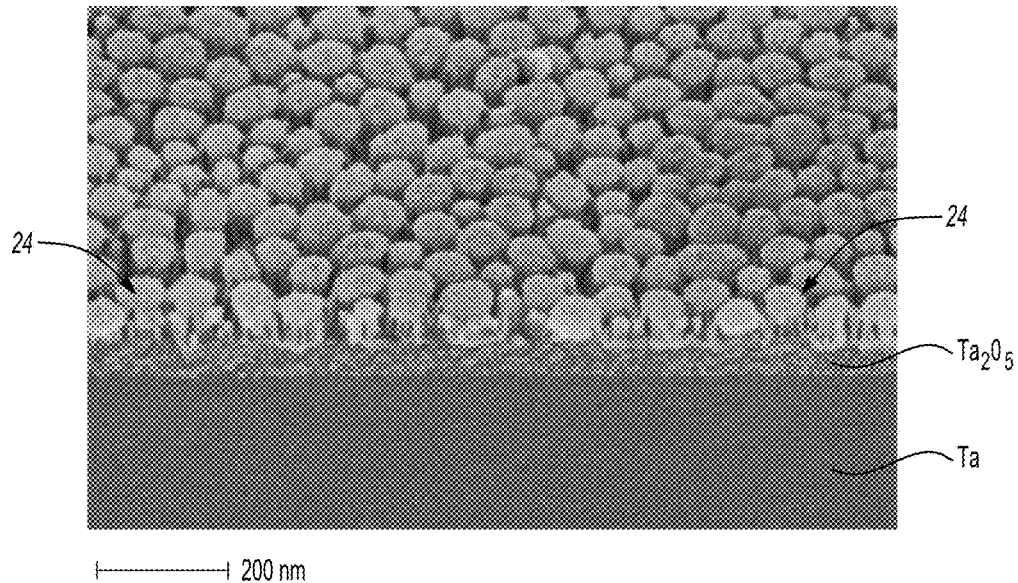
FIG. 5B is a SEM image of a perspective view of the nano-structure shown in FIG. 5A.

A nano-structure was formed using a multi-layer structure of aluminum (300 nm) on tantalum (50 nm). The aluminum was anodized in 2% oxalic acid at 30 V for about 3 minutes and 45 second (i.e., about 90 seconds before the complete aluminum anodization, which was estimated according to option 3 in FIG. 2) to form a porous anodic alumina template having a thickness of about 300 nm. The template was anisotropically etched to increase the pore diameter and to form tracks inside each pore. Etching was accomplished using a 5% $H_3PO_4$ solution for about 30 minutes at a temperature of about 30° C. Thereafter, the remaining aluminum was further anodized. This second aluminum anodization was accomplished using 2% oxalic acid at 30 V until the current density decreased and reached a steady state. This formed paths where tracks had been formed. Tantalum anodization was performed in the same oxalic acid electrolyte using a current density of about 0.8 $mA/cm^2$ until the voltage reached about 120 V, and then anodization was continued for 2 minutes at 120 V. In this example, the entire tantalum layer was anodized. Anodization of the tantalum formed a tantalum pentoxide layer having a thickness (which includes the oxide layer 14' and the super nano-pillars 20) of about 140 nm. It was noted that the overall tantalum pentoxide thickness, including the height of the super nano-pillars, was limited (in part) by the available thickness of the tantalum layer. It is believed that the height of the super nano-pillars is also limited by the height of the paths. The alumina template was removed by etching the template in $H_3PO_4+CrO_3+H_2O$ solution as described herein. FIG. 5A illustrates a transmission electron micrograph (TEM, scale bar is 20 nm) cross-section of a portion of the nano-structure including sets of super nano-pillars, and FIG. 5B illustrates a scanning electron micrograph (SEM, scale bar is 200 nm) image of a perspective view of the same nano-structure.

Example 2

Figure 6A:
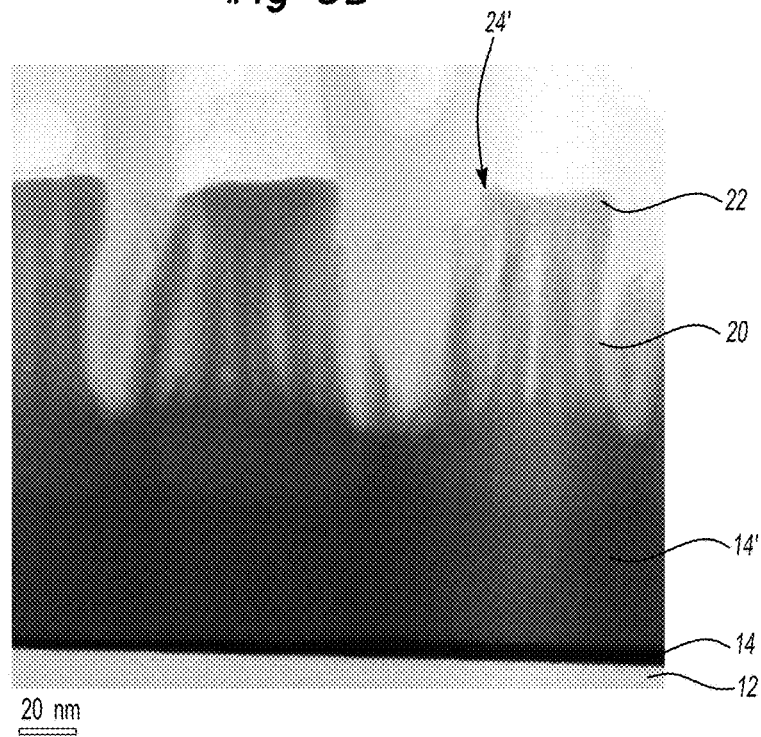
FIG. 6A is a TEM image of a cross section of the nano-structure formed using the embodiment of the method shown in FIGS. 1A through 1E, 1G and 1H.
Figure 6B:
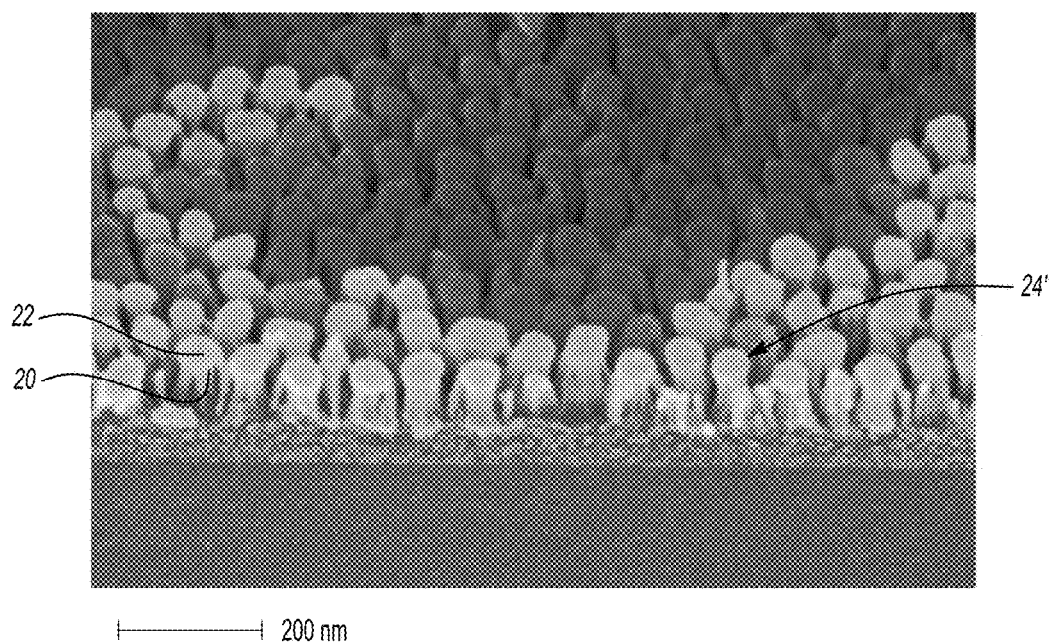
FIG. 6B is a SEM image of a perspective view of the nano-structure shown in FIG. 6A.

A nano-structure was formed using a multi-layer structure of aluminum 300 nm) on tantalum (50 nm). The aluminum was anodized in 2% oxalic acid at 30 V for about 3 minutes and 45 second (i.e., about 90 seconds before the complete aluminum anodization, which was estimated according to option 3 in FIG. 2) to form a porous anodic alumina template having a thickness of about 300 nm. The template was anisotropically etched to increase the pore diameter and to form tracks inside each pore. Etching was accomplished using a 5% $H_3PO_4$ solution for about 15 minutes at a temperature of about 30° C. to form the tracks. Thereafter, the aluminum was further anodized using 2% oxalic acid at 30 V until the current density decreased and reached a steady state. This formed paths where tracks had been formed. Tantalum was then anodized in the same oxalic acid electrolyte using a current density of about 0.8 $mA/cm^2$ until the voltage reached about 120 V, and then anodization was continued for 2 minutes at 120 V. Anodization of the tantalum formed a tantalum pentoxide layer having a thickness (which includes the oxide layer 14', the super nano-pillars 20, and the cap 22) of about 165 nm. It was again noted that the overall tantalum pentoxide thickness, including the height of the super nano-pillars, was limited by the available thickness of the tantalum layer. The alumina template was removed by etching the template in $H_3PO_4+CrO_3+H_2O$ solution as described herein. FIG. 6A illustrates transmission electron micrograph (TEM, scale bar of 20 nm) cross-sections of a portion of the nano-structure including sets of super nano-pillars having a cap layer deposited on each set, and FIG. 6B illustrates a scanning electron micrograph (SEM, scale bar of 200 nm) image of a perspective view of the same nano-structure.

In this example, the short etching time (when compared to Example 1) contributed to the creation of the cap layer. In this example, when compared to Example 1, the paths were smaller and the tantalum pentoxide filling factor was smaller, and thus the amount of tantalum was enough to fill the paths and allow the tantalum pentoxide to grow out of the paths and over portions of the template.

While several embodiments have been described in detail, it will be apparent to those skilled in the art that the disclosed embodiments may be modified. Therefore, the foregoing description is to be considered non-limiting.

What is claimed is:
1. A nano-structure comprising:
   an oxidized layer; and
   at least two sets of super nano-pillars positioned directly on the oxidized layer, each of the at least two sets of super nano-pillars including at least 5 super nano- pillars, and each set being separated by a spaced distance from each other set;

wherein each super nano-pillar is a distance from an adjacent super nano-pillar in a same set and wherein the spaced distance separating each set is greater than the distance separating each super nano-pillar from an adjacent super nano-pillar in the same set, wherein each super nano-pillar has a diameter that ranges from about $\frac{1}{5}^{th}$ to about $\frac{1}{10}^{th}$ of a diameter of a respective set to which the super nano-pillar belongs.

2. The nano-structure as defined in claim 1, wherein each set of super nano-pillars includes a cap layer.

3. The nano-structure as defined in claim 1, wherein each set of super nano-pillars includes from 5 to 15 super nano-pillars.

4. The nano-structure as defined in claim 1, further comprising an oxidizable material layer upon which the oxidized layer is formed.

5. The nano-structure as defined in claim 4, further comprising a substrate upon which the oxidizable material layer is disposed.

6. The nano-structure as defined in claim 4 wherein the oxidized layer is tantalum pentoxide and wherein the oxidizable material layer is tantalum.

7. A nano-structure, comprising:
a substrate;
a tantalum pentoxide layer established on the substrate; and
at least two sets of tantalum pentoxide super nano-pillars positioned directly on the tantalum pentoxide layer, each of the at least two sets of tantalum pentoxide super nano-pillars including at least 5 tantalum pentoxide super nano-pillars, and each set being separated by a spaced distance from each other set;
wherein:
each tantalum pentoxide super nano-pillar is a distance from an adjacent tantalum pentoxide super nano-pillar in a same set,
the spaced distance separating each set is greater than the distance separating each tantalum pentoxide super nano-pillar from an adjacent tantalum pentoxide super nano-pillar in the same set; and
each tantalum pentoxide super nano-pillar has a diameter that ranges from about $\frac{1}{5}^{th}$ to about $\frac{1}{10}^{th}$ of a diameter of a respective set to which the tantalum pentoxide super nano-pillar belongs.

8. The nano-structure as defined in claim 7, further comprising a tantalum layer positioned between the substrate and the tantalum pentoxide layer.

9. The nano-structure as defined in claim 1, wherein each super nano-pillar has a height ranging from about 10 nm to 500 nm.

10. The nano-structure as defined in claim 1, wherein each super nano-pillar is formed from a material that makes up the oxidized layer.

* * * * *